United States Patent [19]
Kikkawa

[11] Patent Number: 5,952,672
[45] Date of Patent: Sep. 14, 1999

[54] SEMICONDUCTOR DEVICE AND METHOD FOR FABRICATING THE SAME

[75] Inventor: Toshihide Kikkawa, Kawasaki, Japan

[73] Assignee: Fujitsu Limited, Kanagawa, Japan

[21] Appl. No.: 09/161,827

[22] Filed: Sep. 29, 1998

[30] Foreign Application Priority Data

Feb. 24, 1998 [JP] Japan ................................. 10-042114

[51] Int. Cl.[6] ....................... H01L 29/06; H01L 31/0328; H01L 31/0336; H01L 31/072

[52] U.S. Cl. ............................... 257/15; 257/18; 257/14; 257/280

[58] Field of Search .............................. 257/15, 18, 14, 257/280

[56] References Cited

U.S. PATENT DOCUMENTS

| | | |
|---|---|---|
| 5,311,035 | 5/1994 | Nire . |
| 5,436,468 | 7/1995 | Nakata et al. . |
| 5,608,229 | 3/1997 | Mukai et al. . |

FOREIGN PATENT DOCUMENTS

| | | |
|---|---|---|
| 3-1546 | 1/1991 | Japan . |
| 4137769 | 5/1992 | Japan . |
| 7-335867 | 12/1995 | Japan . |

*Primary Examiner*—Stephen D. Meier
*Attorney, Agent, or Firm*—Armstrong, Westerman, Hattori, McLeland & Naughton

[57] ABSTRACT

The semiconductor device comprises an $(Al_xGa_{1-x})InP$ layer 20 epitaxially grown on a semiconductor substrate 10 and having a region where the $(Al_xGa_{1-x})InP$ layer 20 has a spontaneous superlattice broken to have a disordered configuration of Al, In and Ga in plane of a Group III atomic layer; and a semiconductor layer 22 epitaxially grown on the $(Al_xGa_{1-x})InP$ layer 20 and having the same conductivity type as the $(Al_xGa_{1-x})InP$ layer 20. In forming the semiconductor layer on the $(Al_xGa_{1-x})InP$ layer, the spontaneous superlattice of the ground $(Al_xGa_{1-x})InP$ layer is broken, whereby the interface between the $(Al_xGa_{1-x})InP$ layer and the semiconductor layer has less traps. Accordingly, low contact resistance can be obtained between the $(Al_xGa_{1-x})InP$ layer and the semiconductor layer.

14 Claims, 10 Drawing Sheets

SEMICONDUCTOR DEVICE AND METHOD FOR FABRICATING THE SAME

BACKGROUND OF THE INVENTION

The present invention relates to a semiconductor device and a method for fabricating the semiconductor device.

InGaP is able to epitaxially grow on GaAs and has a wider energy band gap than GaAs. These characteristics are utilized for InGaP to be applied to various devices.

For example, in a HEMT (High Electron Mobility Transistor), InGaP is used as an electron donating layer for donating electrons to a channel layer, and in an HBT (Hetero-junction Bipolar Transistor), InGaP is used as an emitter layer, which requires a wide band gap.

InGaP has good etching selectivity with respect to compound semiconductor layers containing As element, such as GaAs, AlGaAs, InGaAs, etc. and is widely used in semiconductor devices having structures requiring selective processing.

For example, the specification of Japanese Patent No. 2,581,452 discloses a semiconductor device including an electron donating layer of an InGaP layer formed on a channel layer of a GaAs layer or an InGaAs layer. The semiconductor device described in the specification of Japanese Patent No. 2,581,452 will be explained with reference to FIG. 10.

A buffer layer 102 of GaAs or AlGaAs is formed on a semi-insulating GaAs substrate 10. An electron donating layer 104 of AlGaAs doped with an n-type impurity is formed on the buffer layer 102. A channel layer 106 of GaAs or InGaAs is formed on the electron donating layer 104. An electron donating layer 108 of InGaP is formed on the channel layer 106. On the electron donating layer 108, a lower contact layer 110 of AlGaAs, an intermediate contact layer 112 of InGaP and an upper contact layer 114 of GaAs are formed. A recess region 116 which reaches the electron donating layer 108 is formed in the contact layers 110, 112, 114, and a gate electrode 118 is formed on the exposed electron donating layer 108. A source electrode 120 and a drain electrode 122 are formed on the upper contact layer 114.

As described above, in the semiconductor device described in the specification of Japanese Patent No. 2,581,452, the electron donating layer 108 is formed of InGaP, which has a wider band gap than the channel layer 106 and has good etching selectivity with respect to AlGaAs forming the lower contact layer 110, whereby the semiconductor device can be a HEMT having high performance, homogeneity and reproducibility.

However, in the conventional structure of the semiconductor device, which includes the AlGaAs layer or the GaAs layer on the InGaP layer, resistance in the interface between the InGaP layer and the AlGaAs layer or the GaAs layer is high, which is a cause for high source resistance. This is a new finding by the inventor of the p resent application. This affection is conspicuous especially in semiconductor devices of the structure formed by planar doping, which includes, for higher gate voltage resistance, a doped layer provided at an intermediate part of an electron donating layer 108. These affections are also observed in semiconductor devices including an AlGaAs layer or an GaAs layer on an AlGaInP layer.

Causes for such increase of resistance in the interface between the InGaP layer or the AlGaInP layer and the AlGaAs layer or the GaAs layer have not yet been clarified, and it has been required to make clear these causes.

SUMMARY OF THE INVENTION

An object of the present invention is to provide a semiconductor device having contact resistance reduced in the interface between an $(Al_xGa_{1-x})InP$ layer and a semiconductor layer formed thereon, and a method for fabricating the semiconductor device.

The above-described object can be achieved by a semiconductor device comprising: an $(Al_xGa_{1-x})InP$ layer epitaxially grown on a semiconductor substrate and having a region where the $(Al_xGa_{1-x})InP$ layer has a spontaneous superlattice broken to have a disordered configuration of Al, In and Ga in plane of a Group III atomic layer; and a semiconductor layer epitaxially grown on the $(Al_xGa_{1-x})InP$ layer and having the same conductivity type as the $(Al_xGa_{1-x})InP$ layer. In forming the semiconductor layer on the $(Al_xGa_{1-x})InP$ layer, the spontaneous superlattice of the ground $(Al_xGa_{1-x})InP$ layer is broken, whereby the interface between the $(Al_xGa_{1-x})InP$ layer and the semiconductor layer has less traps. Accordingly, low contact resistance can be obtained between the $(Al_xGa_{1-x})InP$ layer and the semiconductor layer.

In the above-described semiconductor device, it is preferable that the $(Al_xGa_{1-x})InP$ layer including: a first layer formed on the semiconductor substrate and having a spontaneous superlattice in which Al, In and Ga have an ordered configuration in plane of a Group III atomic layer; and a second layer formed on the first layer and having a spontaneous superlattice broken to have a disordered configuration of Al, In and Ga in plane of a Group III atomic layer. To obtain low resistance between the $(Al_xGa_{1-x})InP$ layer and the semiconductor layer, it is effective that an $(Al_xGa_{1-x})InP$ layer having the spontaneous superlattice broken is provided at least near the interface between the $(Al_xGa_{1-x})InP$ layer and the semiconductor layer.

In the above-described semiconductor device, it is preferable that a channel layer formed on the semiconductor substrate, an electron donating layer formed of the $(Al_xGa_{1-x})InP$ layer formed on the channel layer, and a cap layer formed of said semiconductor layer formed on the electron donating layer form a field effect transistor. The $(Al_xGa_{1-x})InP$ layer having the spontaneous superlattice broken is applicable to the electron donating layer of a HEMT. The $(Al_xGa_{1-x})InP$ layer having the spontaneous superlattice broken is applied to the electron donating layer of a HEMT, whereby low source resistance can be obtained. Low channel resistance can also obtained.

In the above-described semiconductor device, it is preferable that the $(Al_xGa_{1-x})InP$ layer has a planar doped region with an impurity doped in plane. In a HEMT having the electron donating layer doped by planar doping, it is very effective that the $(Al_xGa_{1-x})InP$ layer having the spontaneous superlattice broken is applied to the electron donating layer of a HEMT.

In the above-described semiconductor device, it is preferable that the channel layer is formed of a GaAs layer or an InGaAs layer.

In the above-described semiconductor device, it is preferable that a collector layer formed on the semiconductor substrate, a base layer formed on the collector layer, an emitter layer formed of the $(Al_xGa_{1-x})InP$ layer formed on the base layer, and a cap layer formed of said semiconductor layer formed on the $(Al_xGa_{1-x})InP$ layer form a heterobipolar transistor. The $(Al_xGa_{1-x})InP$ layer having the spontaneous superlattice broken is applicable to a HBT. The $(Al_xGa_{1-x})InP$ layer having the spontaneous superlattice broken is applied to obtain low contact resistance between the emitter layer and the emitter cap layer.

In the above-described semiconductor device, it is preferable that said semiconductor layer is formed of a GaAs layer, an AlGaAs layer or an InGaAs layer.

The above-described object can be achieved by a method for fabricating a semiconductor device comprising: the step of forming on a semiconductor substrate an $(Al_xGa_{1-x})InP$ layer having a disordered configuration of Al, In and Ga in plane of a Group III atomic layer by breaking a spontaneous superlattice. The $(Al_xGa_{1-x})InP$ layer has the spontaneous superlattice broken, whereby low contact resistance can be obtained between the semiconductor layer and the layer thereon.

In the above-described semiconductor device, it is preferable that said $(Al_xGa_{1-x})InP$ layer is grown by metal organic chemical vapor deposition at 500–650° C. The $(Al_xGa_{1-x})InP$ layer can have the spontaneous superlattice broken by growing the $(Al_xGa_{1-x})InP$ layer by MOCVD method at a temperature about 500–650° C.

In the above-described semiconductor device, it is preferable that the $(Al_xGa_{1-x})InP$ layer having a spontaneous superlattice in which Al, In and Ga have an ordered configuration in plane of a Group III atomic layer is formed on the semiconductor substrate, and the $(Al_xGa_{1-x})InP$ layer is subjected to rapid thermal annealing to break the spontaneous superlattice to have a disordered configuration of Al, In and Ga in plane of the Group III atomic layer. The $(Al_xGa_{1-x})InP$ layer can have the spontaneous superlattice broken by subjecting the $(Al_xGa_{1-x})InP$ layer having the spontaneous superlattice to rapid thermal annealing.

In the above-described semiconductor device, it is preferable that an Al composition X of the $(Al_xGa_{1-x})InP$ layer is not less than 0 and not more than 0.75.

In the above-described semiconductor device, it is preferable that the Al composition X of the $(Al_xGa_{1-x})InP$ layer is 0 and the $(Al_xGa_{1-x})InP$ layer is a InGaP layer.

The above-described object can be achieved by a method for fabricating a semiconductor device comprising the steps of: epitaxially growing on a semiconductor substrate a first semiconductor layer by metal organic chemical vapor deposition at a first temperature; epitaxially growing on the first semiconductor layer an $(Al_xGa_{1-x})InP$ layer having a spontaneous superlattice broken to have a disordered configuration of Al, In and Ga in a plane of a Group III atomic layer by metal organic chemical vapor deposition at a second temperature lower than the first temperature; and epitaxially growing a second semiconductor layer on the $(Al_xGa_{1-x})InP$ layer by metal organic chemical vapor deposition at a third temperature substantially equal to the first temperature.

In the above-described method for fabricating a semiconductor device, it is preferable that the first temperature and the third temperature are 650–700° C., and the second temperature is 500–650° C.

The above-described object can be achieved by a method for fabricating a semiconductor device comprising the steps of: epitaxially growing on a semiconductor substrate by metal organic chemical vapor deposition a first semiconductor layer, an $(Al_xGa_{1-x})InP$ layer having a spontaneous superlattice in which Al, In and Ga have an ordered configuration in plane of a Group III atomic layer, and a second semiconductor layer; and subjecting the $(Al_xGa_{1-x})InP$ layer to rapid thermal annealing to break the spontaneous superlattice so that the $(Al_xGa_{1-x})InP$ layer has a disordered configuration of Al, In and Ga in plane of the Group III atomic layer.

In the above-described method for fabricating a semiconductor device, it is preferable that the method further comprises the step of planar doping the $(Al_xGa_{1-x})InP$ layer.

In the above-described method for fabricating a semiconductor device, it is preferable that the first semiconductor layer is a GaAs layer, an InGaAs layer or the $(Al_xGa_{1-x})InP$ layer of a spontaneous superlattice having an ordered configuration of Al, In and Ga in plane of a Group III atomic layer; and the second semiconductor layer is a GaAs layer, an AlGaAs layer or an InGaAs layer.

DETAILED DESCRIPTION OF THE INVENTION

The present invention is based on a phenomena found for the first time by the inventor of the present invention.

That is, the inventor of the present invention has found for the first time that resistance increase in the interface between an InGaP layer and a GaAs layer or others formed on the InGaP layer is caused by the spontaneous superlattice of the InGaP layer, and the spontaneous superlattice of the InGaP layer is broken to thereby mitigate the resistance increase in the interface.

Figure 1A:
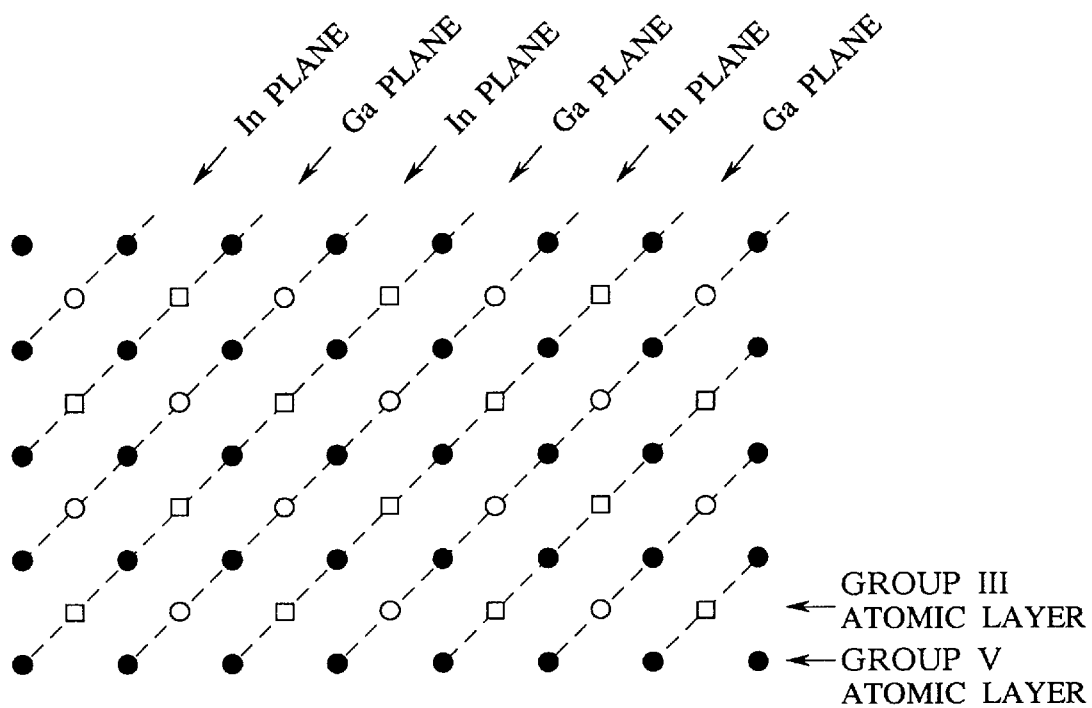
FIGS. 1A and 1B are a views explaining the spontaneous superlattice of InGaP.

InGaP layer grown by the usual semiconductor layer deposition method, e.g., MOCVD (Metal Organic Chemical Vapor Deposition) method comprises, as shown in FIG. 1A, atomic layers of Group III atoms (In and Ga) and atomic layers of a Group V atom (P) alternately laid one on another, and In and Ga are alternately arranged in plane of the atomic layer of Group III atom (hereinafter such crystal configuration is called by "spontaneous superlattice"). Such spontaneous superlattice is formed because such configuration is most stable in film forming process.

Figure 1B:
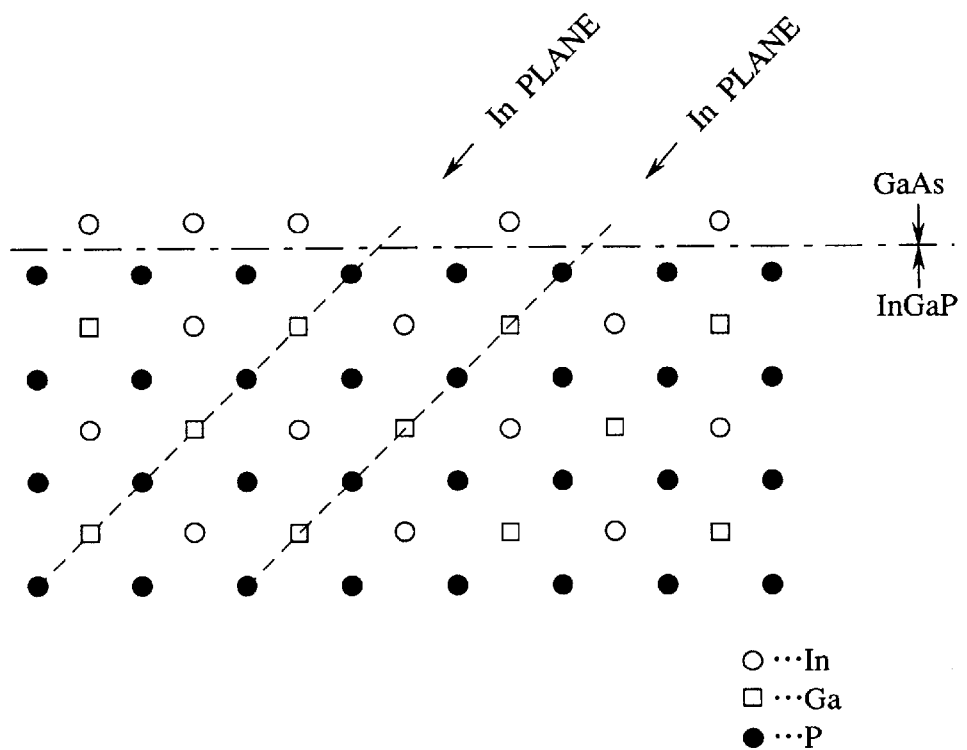

However, in depositing, e.g., a GaAs layer, which contains no In, on the thus-formed InGaP layer having the spontaneous superlattice, it is difficult that Ga atoms are located at sites (indicated by "In planes" in the drawing)

where In atoms should be located at the lattice period of InGaP (see FIG. 1B), with a result that a stress is caused in the interface between the grown GaAs layer and the InGaP layer, and a trap is induced, which leads to the resistance increase.

In view of this, the inventor of the present application made studies and found that an InGaP layer without the spontaneous superlattice is formed to thereby reduce traps between the InGaP layer, and an AlGaAs layer or a GaAs layer and restrain the resistance increase in the interface. An InGaP layer without the spontaneous superlattice can be formed by growing the InGaP at a low temperature (below about 600° C.) or breaking the spontaneous superlattice by rapid thermal annealing following the growth.

The present invention will be specified by means of embodiments of the present invention.

[A First Embodiment]

The semiconductor device and the method for fabricating the same according to a first embodiment of the present invention will be explained with reference to FIGS. 2 to 7.

Figure 2:
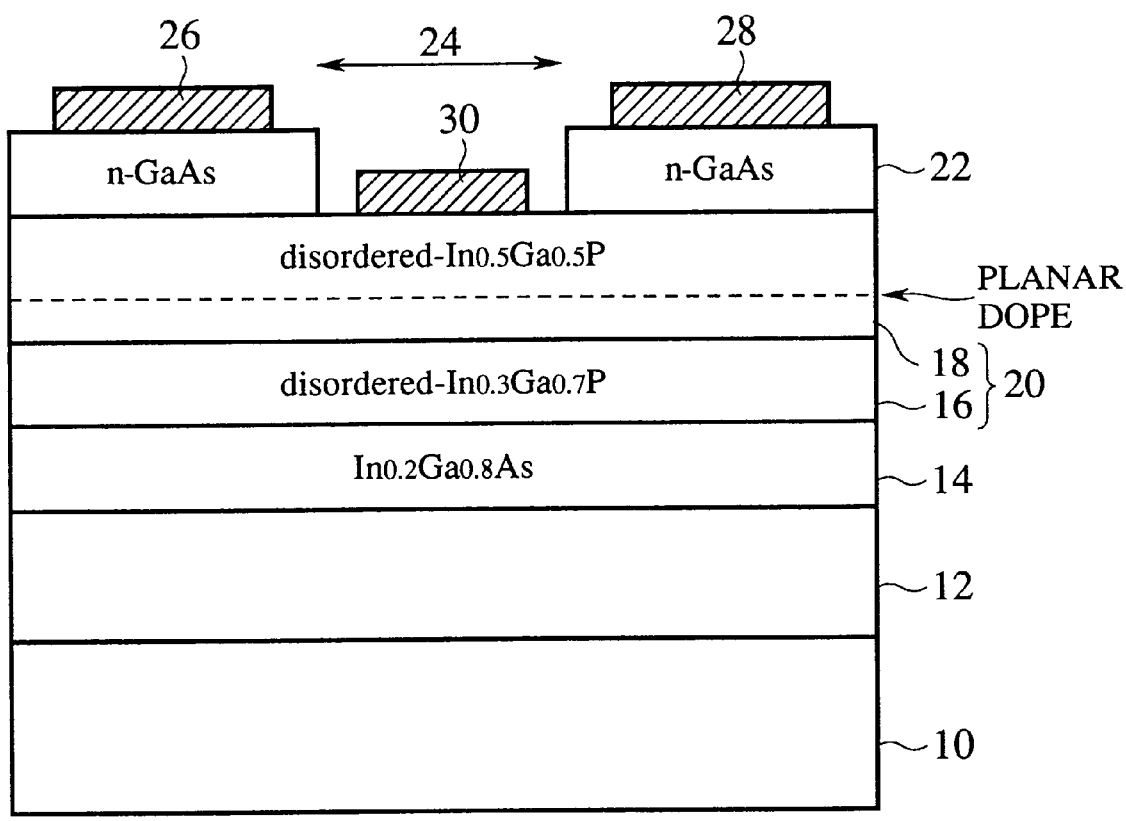
FIG. 2 is a diagrammatic sectional view of the semiconductor device according to a first embodiment of the present invention, which shows a structure thereof.
Figure 3:
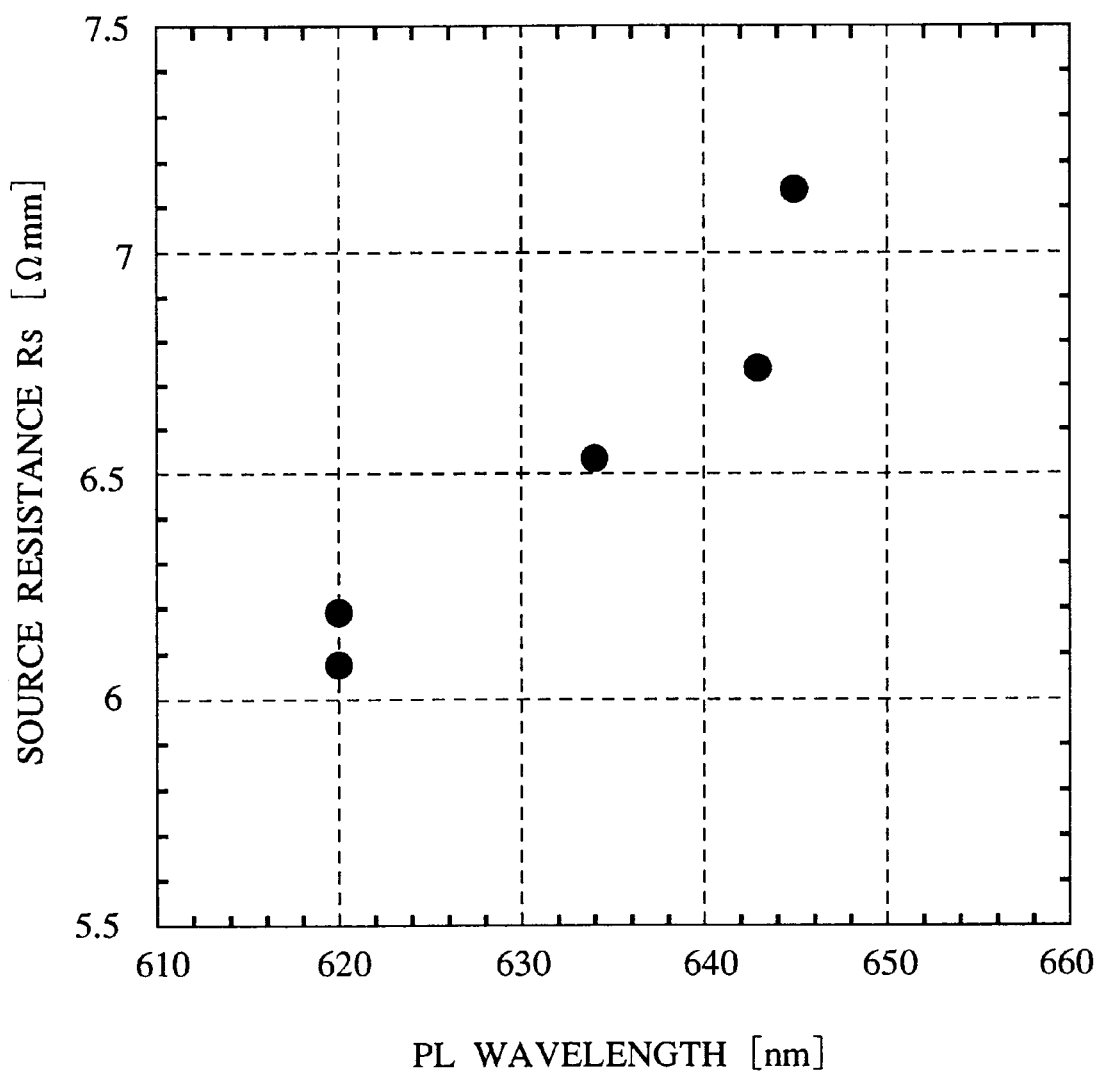
FIG. 3 is a graph of relationships between source resistances and PL wavelengths of the semiconductor device according to the first embodiment of the present invention.
Figure 4:
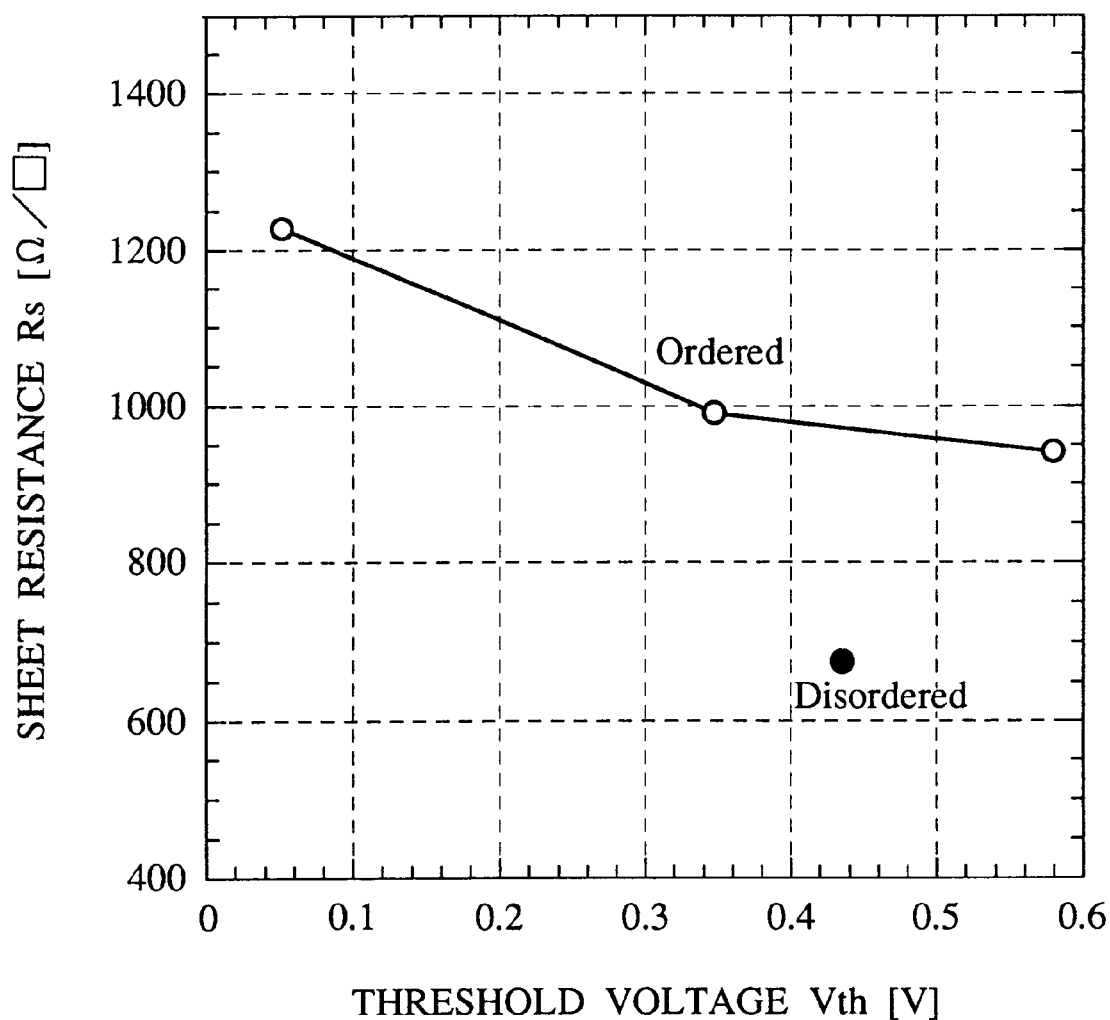
FIG. 4 is a graph of relationships between sheet resistances of the channel layer and threshold voltages of the semiconductor device according to the first embodiment of the present invention.
Figure 5A:
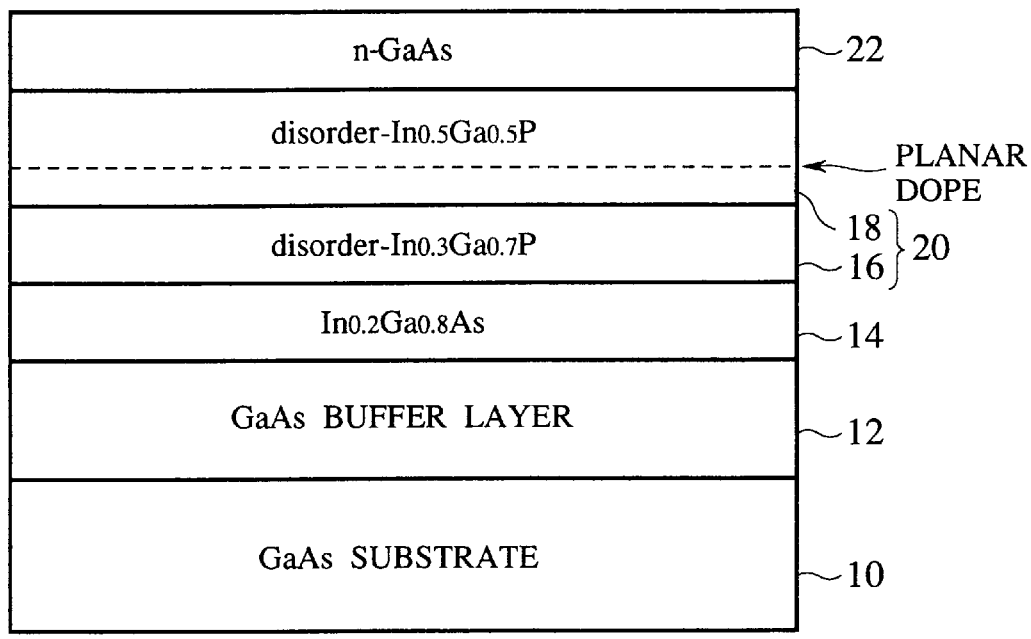
FIGS. 5A–5B and 6 are sectional views of the semiconductor device according to the first embodiment of the present invention in the steps of the method for fabricating the same, which show the method.
Figure 5B:
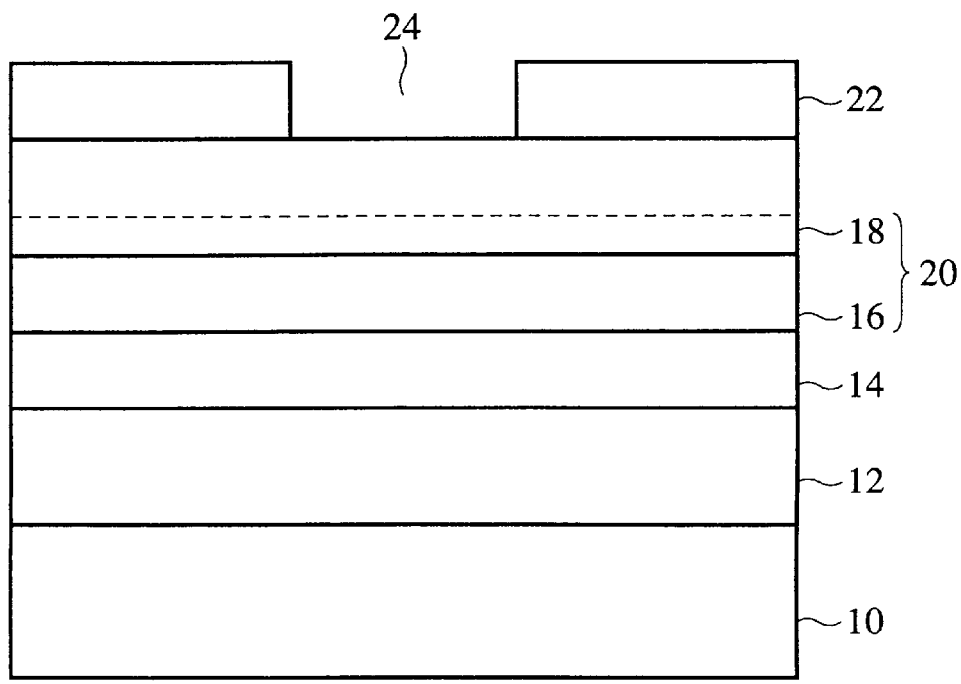
Figure 6:
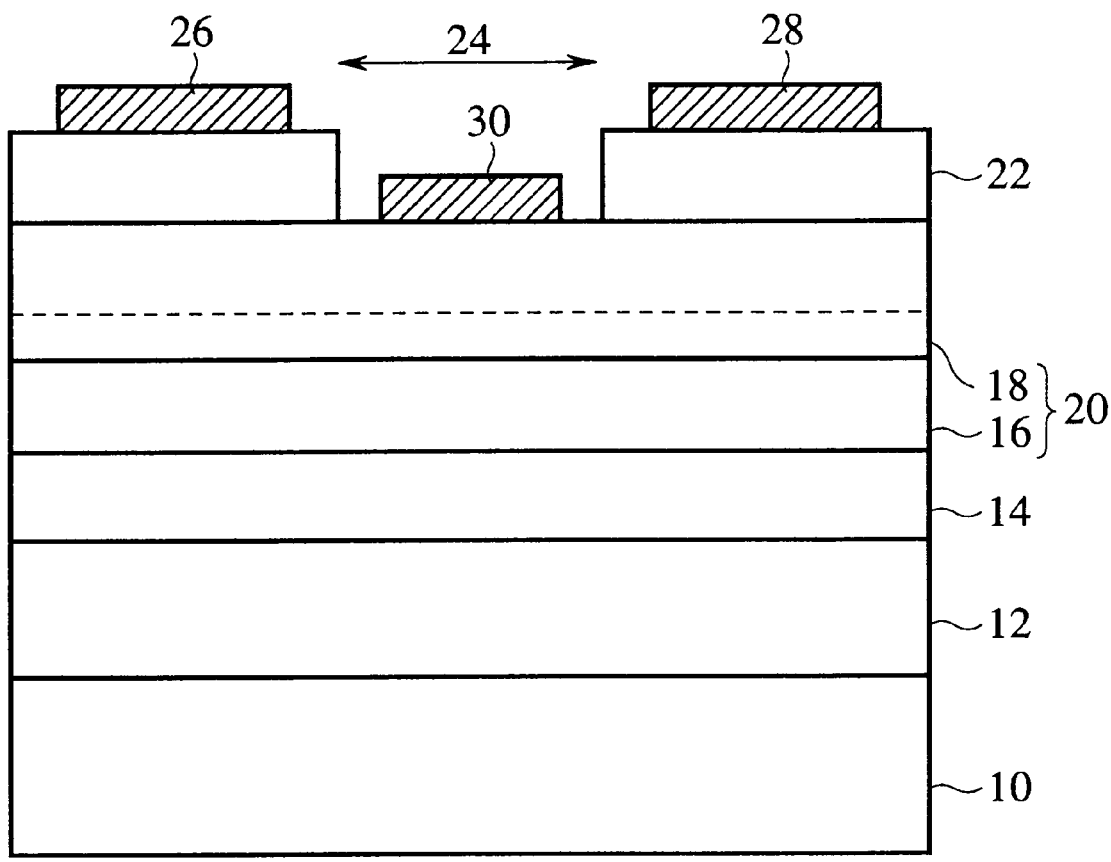
Figure 7:
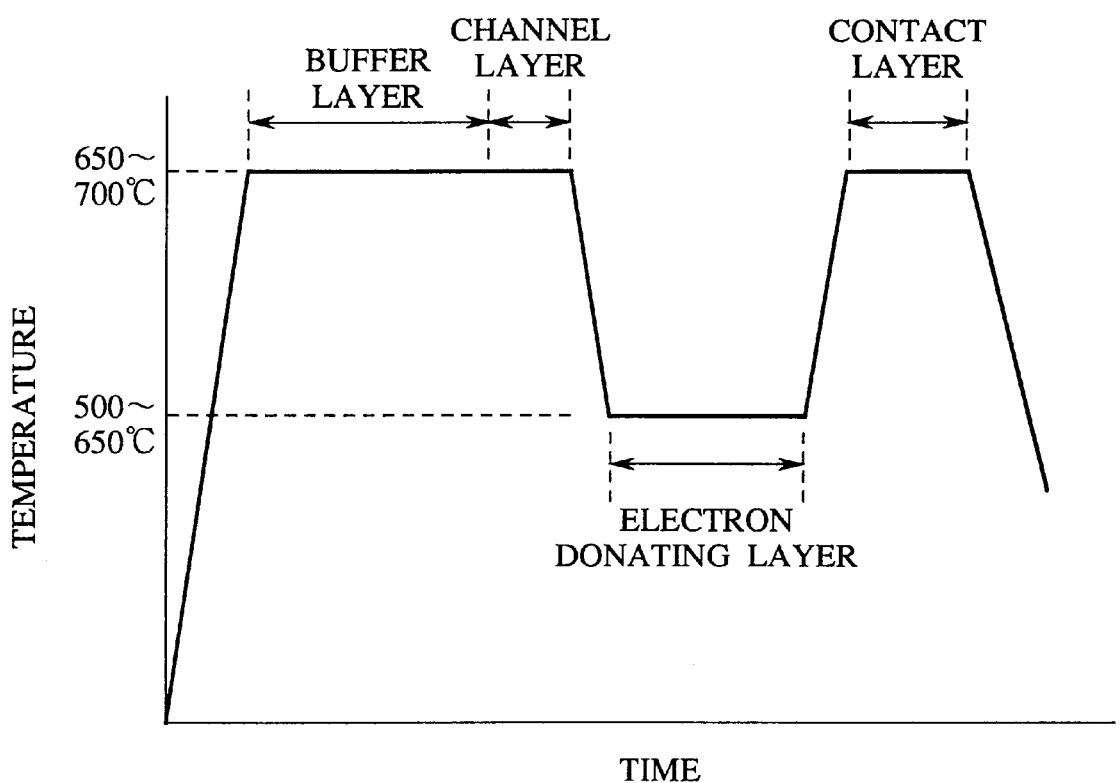
FIG. 7 is a graph of film depositing temperatures of the method for fabricating the semiconductor device according to the first embodiment of the present invention.

FIG. 2 is a diagrammatic sectional view of the semiconductor device according to the present embodiment, which shows a structure thereof. FIG. 3 is a graph of relationships between source resistances and PL wavelengths of the semiconductor device according to the present embodiment. FIG. 4 is a graph of relationships between sheet resistances of the channel layer and threshold voltages of the semiconductor device according to the present embodiment. FIGS. 5A–5B and 6 are sectional views of the semiconductor device in the steps of the method for fabricating the semiconductor device according to the present embodiment. FIG. 7 is a graph of film depositing temperatures in the method for fabricating the semiconductor device according to the present embodiment.

First, the structure of the semiconductor device according to the present embodiment will be explained with reference to FIG. 2. In the present embodiment, one example of applications of the present invention to a HEMT using an InGaP layer as an electron donating layer.

A buffer layer 12 of an about 600 nm-thick GaAs layer is formed on a semi-insulating GaAs substrate 10. A channel layer 14 of an about 14 nm-thick $In_{0.2}Ga_{0.8}As$ layer is formed on the buffer layer 12. An electron donating layer 20 of InGaP layer is formed on the channel layer 14. The electron donating layer 20 comprises an about 2.5 nm-thick $In_{0.3}G_{0.7}P$ layer 16 and an about 15.5 nm-thick $In_{0.5}Ga_{0.5}P$ layer 18, and Si of a $8\times10^{18}$ cm$^{-3}$ concentration are planar-doped in a region in the $In_{0.5}Ga_{0.5}P$ layer 18, which is spaced by about 5 nm from the channel layer. The InGaP layers 16, 18 have crystal structures having disordered configurations without the spontaneous superlattices. In the present specification, a crystal structure of a disordered configuration means configurations of In atoms and Ga atoms are disordered in plane of a Group III atom layer (represented by "disordered" in the drawing) to be discriminated over InGaP with the spontaneous superlattice (represented by "ordered" in the drawing). A contact layer 22 of an about 70 nm-thick and a $4\times10^{18}$ cm$^{-3}$ electron concentration is formed on the electron donating layer 20. A recess region 24 which reaches the electron donating layer 20 is formed in the contact layer 22. A gate 30 is formed on the exposed electron donating layer 20 in the recess region 24. A source electrode 26 and a drain electrode 28 are formed on the upper surface of the contact layer 22.

As described above, the semiconductor device according to the present embodiment is characterized in that the electron donating layer 20 is formed of an InGaP layer of a crystal structure which does not have the spontaneous superlattice but a disordered configuration. The electron donating layer 20 is formed of an InGaP layer having a crystal structure of a disordered configuration, whereby carrier concentration decreased in the interface between the electron donating layer 20 and the GaAs contact layer 22 formed on the electron donating layer 20 can be prevented, and thereby source resistance be decreased.

FIG. 3 is a graph of relationships between source resistances and PL wavelengths. In FIG. 3, source resistances are taken on the vertical axis, and luminescence wavelengths of InGaP at 77 K are taken on the horizontal axis. The InGaP crystal has the spontaneous superlattice at an about 646 nm-luminescence wavelength, and exhibits advance of breakdown of the spontaneous superlattice as the luminescence wavelength decreases, and at an about 620 nm-luminescence wavelength exhibits substantially perfect disordered configuration.

As shown in FIG. 3, the source resistance is decreased as the luminescence wavelength of the InGaP is decreased. That is, it is found that the source resistance can be decreased as the crystal structures of the InGaP layers 16, 12 come nearer disordered configurations.

The semiconductor device according to the present embodiment includes the $In_{0.3}G_{0.7}P$ layer having a different composition ratio formed between the $In_{0.5}Ga_{0.5}$ 5P layer 18 and the channel layer, and this is based on the following ground.

The InGaP layer which lattice-matched with GaAs is $In_{0.5}Ga_{0.5}P$ when an In composition is about 0.5. However, in a case that the $In_{0.5}Ga_{0.5}P$ layer is deposited directly on an $In_{0.2}Ga_{0.8}As$ layer of the channel layer 14, carriers in the channel layer often have low mobilities. This will be because the P (phosphorus) in the $In_{0.5}Ga_{0.5}P$ and the Si, which is a dopant are diffused in the $In_{0.2}Ga_{0.8}As$ layer due to crystal strain thereof. In view of this, in the semiconductor device according to the present embodiment, the $In_{0.3}Ga_{0.7}P$ layer 16 having crystal strain in a direction opposite to that of crystal strain of the $In_{0.2}Ga_{0.8}As$ layer 14 is inserted between the $In_{0.5}Ga_{0.5}P$ layer 18 and the $In_{0.2}Ga_{0.8}As$ layer 14 to restrain the diffusion of the P and the Si.

An InGaP layer having the crystal structure of a disordered configuration is applied to the electron donating layer 20, whereby the channel layer can have reduced sheet resistance.

FIG. 4 shows a graph of relationships between sheet resistances $R_s$, of the channel layer 14 and threshold voltages $V_{th}$ thereof.

As shown in FIG. 4, in a case that the electron donating layer 20 is formed of the InGaP layer having the spontaneous superlattice (ordered) in comparison with a case that the electron donating layer 20 is formed of the InGaP layer having the crystal structure of a disordered configuration (disordered), the channel layer 14 can have much reduced sheet resistance.

A mechanism which allows the channel layer 14 to have reduced sheet resistance by forming the electron donating layer 20 of the InGaP layer which does not have the spontaneous superlattice is not clear, but this will be due to crystal strain decrease in the InGaP layer and band gap changes of the InGaP.

That is, the electron donating layer 20 has a crystal structure of a disordered configuration, whereby the InGaP layer can have crystal strain further restrained. In comparison with the case that the electron donating layer 20 is formed of the InGaP layer having the spontaneous superlattice, in the case that the electron donating layer 20 is formed of the InGaP layer having the crystal structure of a disordered configuration, the above-described P and Si diffusion is further restrained, and the influence on the sheet resistance of the channel layer 14 will be able to be further reduced.

The InGaP having the crystal structure of a disordered configuration has a wider energy band gap than the InGaP having the spontaneous superlattice, which makes the effect of the channel layer 14 confining electrons more conspicuous, and reduced channel resistance will be obtained.

The InGaP layer having the crystal structure of a disordered configuration is thus applied to the electron donating layer 20, whereby reduced longitudinal resistance (source resistance) between the contact layer 22 and the electron donating layer 20 is obtained, and the channel layer 14 can have reduced transverse resistance.

Then, the method for fabricating the semiconductor device according to the present embodiment will be explained with reference to FIGS. 5 to 7.

First, a buffer layer 12 of an about 600 nm-thick GaAs layer and a channel layer 14 of an about 14 nm-thick $In_{0.2}Ga_{0.8}As$ layer, an $In_{0.3}Ga_{0.7}P$ layer 16 of an about 2.5 nm-thick, an $In_{0.5}Ga_{0.5}P$ layer 18 of an about 15.5 nm-thick, and a contact layer 22 of an about 70 nm-thick and a $4 \times 10^{18}$ cm$^{-3}$ electron concentration n-GaAs layer are grown in the stated order on a (100) oriented and a 2°-offset angle-semi-insulating GaAs substrate 10 by, e.g., MOCVD (FIG. 5A).

In this time, the $In_{0.5}Ga_{0.5}P$ layer 18 spaced by about 5 nm from the $In_{0.2}Ga_{0.8}As$ layer is planar-doped with Si. The planar-doping is performed by feeding a Si-content raw material gas into a reaction furnace with the feed of a Group III raw material paused, i.e., the growth of the $In_{0.2}Ga_{0.8}As$ layer paused. Si is introduced into the $In_{0.2}Ga_{0.8}As$ layer so that a peak concentration of $8 \times 10_{18}$ cm$^{-3}$ and a full width at half-maximum of an about 5 nm, for example, can be obtained. It is preferable that the planar-doping is performed at a below 10 nm-doping range of an impurity, a $5 \times 10^{17}$ to $1 \times 10^{19}$ cm$^{-3}$ dose and an about 2 to 10 nm-distance between the channel layer 14 and a doping position.

As a reaction furnace for the crystal growth, a low pressure horizontal furnace is used. As a Group III material, TMG (Trimethylgallium), TEG (Triethylgallium) or TMI (Trimethylindium), for example, is used, and $AsH_3$ or $PH_3$, for example, is used as a Group V material. A growth pressure is, e.g., 76 Torr.

Here, the method for fabricating the semiconductor device according to the present embodiment is characterized in that the InGaP layers 16, 18 to be the electron donating layer 20 is formed at a growing temperature as low as below about 600° C.

In the method for fabricating the conventional semiconductor device, a growing temperature is kept at substantially constant from the growth of the buffer layer 14 to that of the contact layer 22. This is because it is considered preferable for requirements of reproducibility of the deposition, etc. to kept a growing temperature constant. Accordingly, in the method for fabricating the conventional semiconductor device, the buffer layer 12, the layer 14, the electron donating layer 20 and the contact layer 22 are grown at a constant temperature of 650 to 700° C.

These layers are grown at 650–700° C. because in the conventional semiconductor device, even in a case that an InGaP layer is used, an AlGaAs layer is often used as an etching stopper film, and the growth at the high temperature is essential to ensure crystallinity of the AlGaAs, and the all layers including the InGaP layer are grown at the high temperature not to add the step of changing the temperature to the fabrication process. The buffer layer 12 is not grown at a low temperature because in a case that the buffer layer 12 is grown at the low temperature, oxygen mixes into the film to form traps, with a resultant problem that the device has deteriorated highfrequency characteristics.

In contrast to this, in the semiconductor device according to the present embodiment, the InGaP layers 16, 18 are grown at a low temperature because when InGaP is grown at below about 600° C., preferably at about 550° C., the InGaP layers 16, 18 do not have the spontaneous superlattice but the crystal structure of disordered configurations. On the other hand, when a growing temperature is below 500° C., a large quantity of carbon is mixed in the films, and conspicuous degraded crystallinity takes place. Thus, it is preferable that the InGaP layers 16, 18 are grown in a 500–650° C. temperature range.

Thus, in the method for fabricating the semiconductor device according to the present embodiment, the buffer layer 12 and the channel layer 14 are grown at 650–700° C. as in the method for fabricating the conventional semiconductor device, then the InGaP layers 16, 18 are grown at a low temperature of about 550° C., and then the contact layer 22 is grown at 650–700° C. as in the method for fabricating the conventional semiconductor device (see FIG. 7).

It is considered that the layers other than the InGaP layers 16, 18 are also grown at the low temperature, but it will be preferable to grown the InGaP layers 16, 18 alone at the low temperature as in the present embodiment in consideration of the unpreferable growth of the buffer layer 12 at the low temperature and the process incompatibility of the use of the AlGaAs layer, which have been described above, and others. However, because the above-described effects of the present invention can be produced by growing the InGaP layers at the low temperature, it is not necessary to grow the layers other than the InGaP layers at different temperatures from the growth temperature of the InGaP layers as long as the above-described problems do not affect characteristics of the semiconductor device or can be solved by other means.

The InGaP layers 16, 18 are thus grown, whereby no trap is induced in the interface between the contact layer 22 grown thereon, and the same, and longitudinal resistance increase in the contact region and sheet resistance increase of the channel layer 14 can be prevented.

Then, a recess region 24 reaching the InGaP layer 18 is formed in the contact layer 22 (FIG. 5B). The recess region 24 corresponds to a region where the gate electrode 30 is to be formed in a later step.

Subsequently, an AuGe/Ni film, for example, is deposited and patterned to form the source electrode 26 and the drain electrode 28 formed on the contact layer 22 on both sides of the recess region 24, and the gate electrode formed on the electron donating layer 20 in the recess region 24 (FIG. 6).

A transistor having a 0.15 $\mu$m-gate length is formed by electron beam lithography. A semiconductor device having k value of an about 950 mA/V/mm$^2$ at a 1 V source-drain voltage and channel conductance $g_m$ of an about 680 mS/mm could be obtained. The semiconductor device had much improved characteristics in comparison with the conventional semiconductor device having k value of a 600 mA/V/mm$^2$ and channel conductance $g_m$ of an about 350 mS/mm.

As described above, according to the present embodiment, the electron donating layer 20 of the field effect transistor is formed of the InGaP layers 16, 18 having the crystal structure of disordered configurations, whereby lower longitudinal resistance between the contact layer and the electron donating layer 20 can be obtained, and low transverse resistance of the channel layer 14 can be obtained.

In the present embodiment, the InGaP layers 16, 18 having the crystal structure of disordered configurations are formed by low-temperature growth but may be formed by other process. For example, the spontaneous superlattice of the InGaP layers 16, 18 can be broken by growing the buffer layer 12, the channel layer 14, the electron donating layer 20 and the contact layer 22 and next subjecting them to RTA (Rapid Thermal Annealing) at 800° C. for about 10 seconds. The InGaP layers having the crystal structure of disordered configurations can be formed by changing an angle of depression of the substrate during the film deposition.

In the present embodiment, the electron donating layer 20 is formed of the InGaP layers having the crystal structure of disordered configurations for the purpose of obtaining both low longitudinal resistance of the contact and low channel resistance, but the effect of low longitudinal resistance of the contact can be produced by forming the InGaP layer of the crystal structure of a disordered configuration at least near the interface between the electron donating layer 20 and the contact layer 22.

Figure 8:
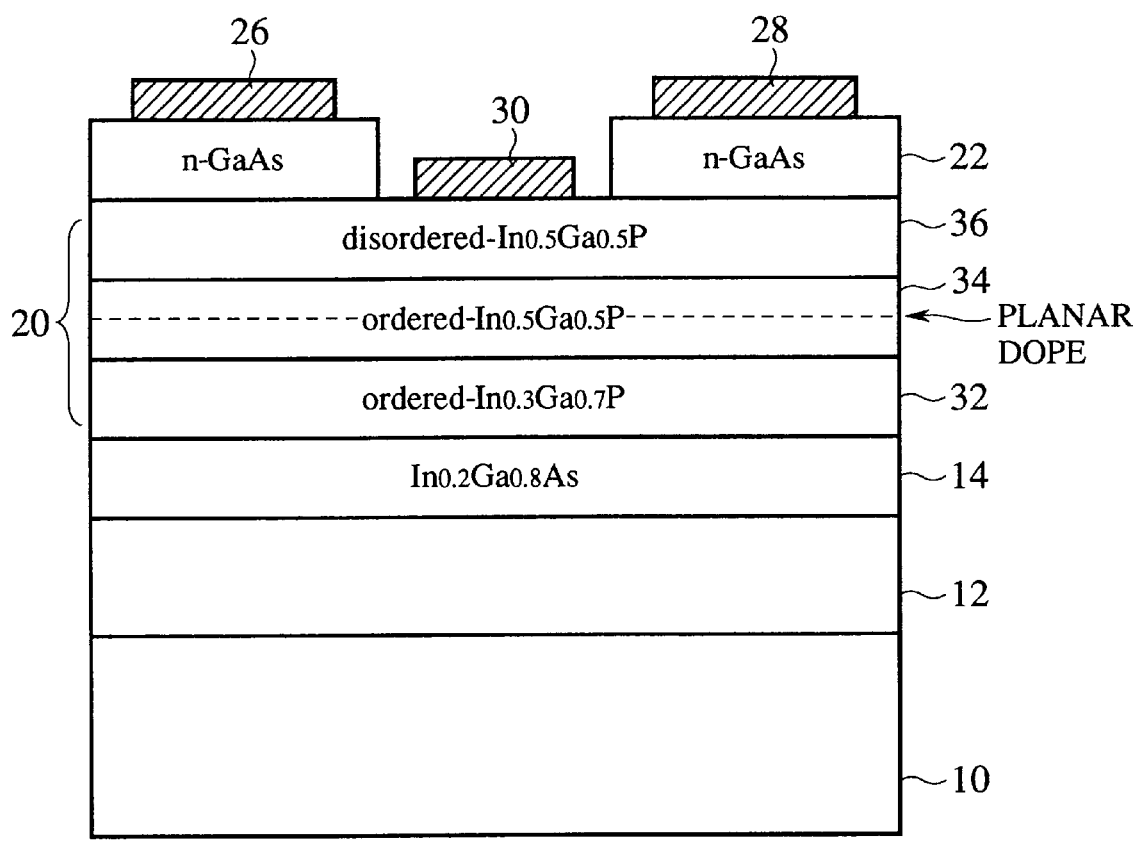
FIG. 8 is a diagrammatic sectional view of a modification of the semiconductor device according to the first embodiment of the present invention, which shows a structure thereof.

Accordingly, as exemplified in FIG. 8, the electron donating layer 20 is formed of an about 2.5 nm-thick $In_{0.3}Ga_{0.7}P$ layer 32 having the spontaneous superlattice, an about 5.5 nm-thick $In_{0.5}Ga_{0.5}P$ layer 34 having the spontaneous superlattice and an 10 nm-thick $In_{0.5}Ga_{0.5}P$ layer 36 having the spontaneous superlattice broken, whereby low longitudinal resistance of the contact can be obtained.

[A Second Embodiment]

The semiconductor device and the method for fabricating the same according to a second embodiment of the present invention will be explained with reference to FIG. 9.

Figure 9:
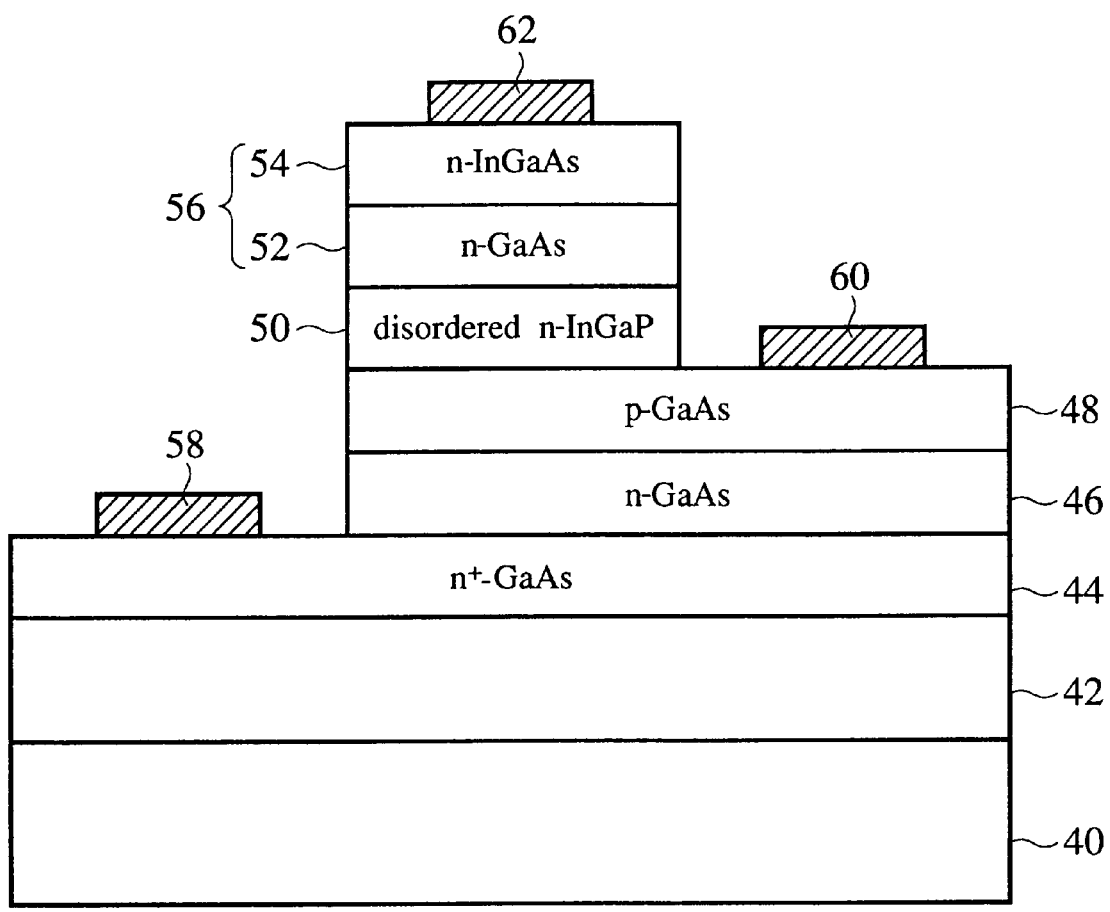
FIG. 9 is a diagrammatic sectional view of the semiconductor device according to a second embodiment of the present invention, which shows a structure thereof.
Figure 10:
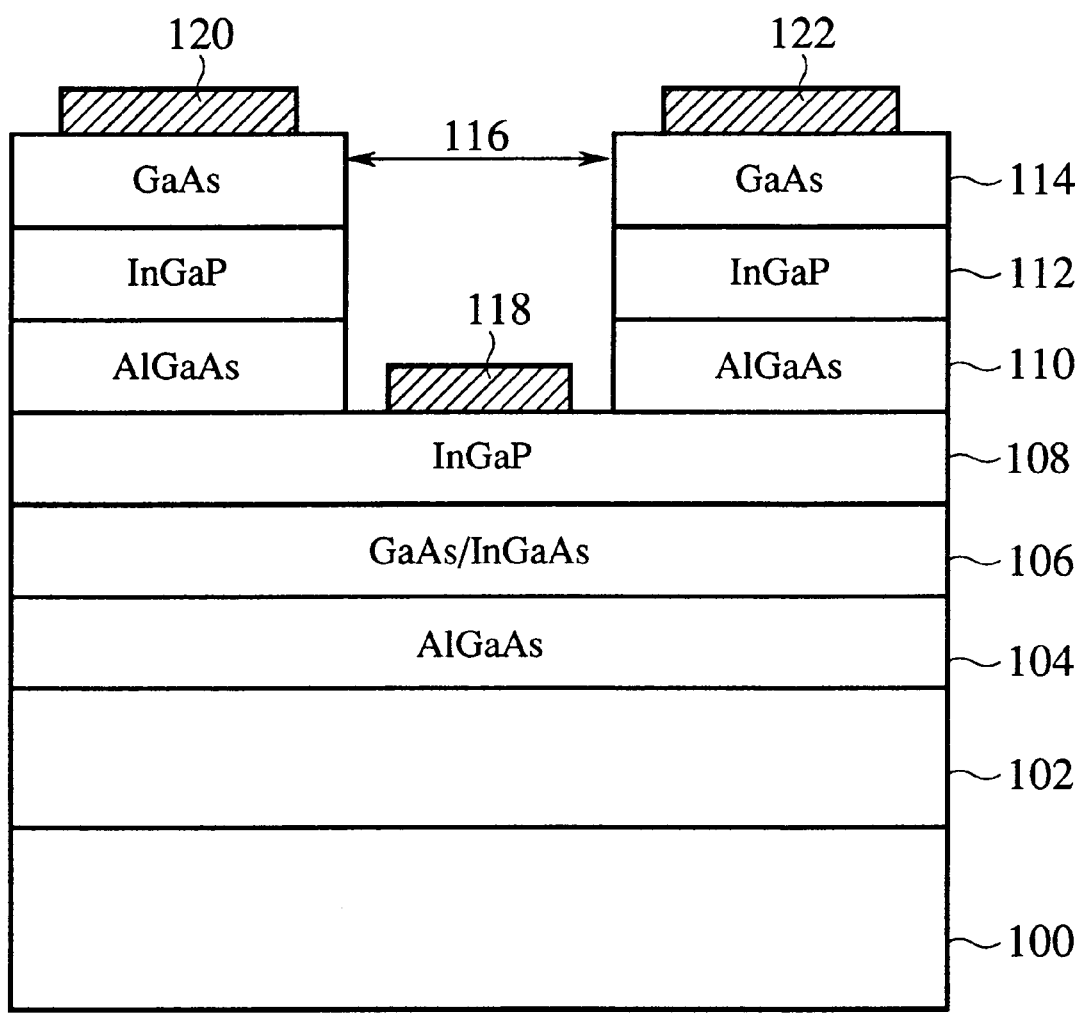
FIG. 10 is a diagrammatic sectional view of the conventional semiconductor device, which shows a structure thereof.

FIG. 9 is a diagrammatic sectional view of the semiconductor device according to the present embodiment.

The semiconductor device and the method for fabricating the same according to the first embodiment is one example in which the present invention is applied to a HEMT using InGaP layers as the electron donating layer but is applicable to other devices. In the present embodiment one example in which the present invention is applied to a HBT will be explained.

On a semi-insulating GaAs substrate 40, there are deposited in the order to be stated below an i-GaAs layer 42 of an about 400 nm-thick, a sub-collector layer 44 of n-GaAs of an about 300 nm-thick and an about $1 \times 10^{18}$ cm$^{-3}$ donor concentration, a collector layer 46 of n-GaAs of an about 500 nm-thick and an about $1 \times 10^{16}$ cm$^{-3}$ donor concentration, a base layer 48 of p-GaAs of an about 100 nm-thick and an about $3 \times 10^{19}$ cm$^{-3}$ acceptor concentration, an emitter layer 50 of n-InGaP of an about 200 nm-thick and an about $5 \times 10^{17}$ $cm^{-3}$ donor concentration, and an n-GaAs layer 52 of an about 50 nm-thick and an about $1 \times 10^{18}$ cm$^{-3}$ donor concentration, and an n-InGaAs layer 54 of an about 50 nm-thick and an about $3 \times 10^{19}$ cm$^{-3}$ donor concentration. An emitter electrode 62 is formed on the n-InGaAs layer 54. The n-GaAs layer 52 and the n-InGaAs layer 54 are an emitter cap layer 56 for decreasing serial resistance between the emitter layer 50 and the emitter electrode 62.

The base layer 48 and the collector layer 46 are patterned in the same mesa shape. A collector electrode 58 is formed on the exposed sub-collector layer 44.

The emitter layer 50 and the emitter cap layer 56 are patterned in the same mesa shape. A base electrode 60 is formed on the exposed base layer 48.

The semiconductor device according to the present embodiment is characterized in that the n-InGaP layer forming the emitter layer 50 is formed of an InGaP layer of the crystal structure having a disordered configuration.

The emitter layer 50 is formed of the InGaP layer of the crystal structure having a disordered configuration, whereby no trap due to stress is induced into the interface between the n-GaAs layer 52 formed on the emitter layer and the same, and low resistance can be obtained between the emitter layer 50 and the emitter cap layer 56.

The InGaP layer of the crystal structure having a disordered configuration can be grown at the low temperature or by breaking the spontaneous superlattice by RTA in the same way as in the method for fabricating the semiconductor device according to the first embodiment.

As described above, according to the present embodiment, in a HBT including the emitter layer 50 of an InGaP layer, the emitter layer 50 is formed of the InGaP layer of the crystal structure having a disordered configuration, and low contact resistance can be obtained between the emitter layer 50 and the emitter cap layer 56.

Although the first embodiment is one example in which the present invention is applied to a HEMT, and the second embodiment is one example in which the present invention is applied to a HBT, the present invention is applicable to other devices.

The present invention mainly aims at reducing resistance due to traps due to the spontaneous superlattice of the InGaP layer and is widely applicable to semiconductor devices each including a semiconductor layer, e.g., a GaAs layer, AlGaAs layer or InGaAs layer, which is formed on the InGaP layer, electrically connected thereto.

In the above-described embodiments, the present invention is applied to a semiconductor device including a GaAs layer, AlGaAs layer or InGaAs layer formed on an InGaP layer. However, the present invention can be also applied to a semiconductor device including a GaAs layer, AlGaAs layer or InGaAs layer formed on an $(Al_xGa_{1-x})InP$ layer. In the $(Al_xGa_{1-x})InP$ system, the present invention can be achieved by forming an $(Al_xGa_{1-x})InP$ layer having a spontaneous superlattice broken to have a disordered configuration of Al, In and Ga in plane of a Group III atomic layer. In the $(Al_xGa_{1-x})InP$, it is preferable that the Al composition (X) is 0–0.75. X=0 corresponds to InGaP. It is preferable that the In composition of the $(Al_xGa_{1-x})InP$ is selected based on the lattice constant of the semiconductor layer formed thereon. When a GaAs layer is formed on the $(Al_xGa_{1-x})InP$ layer, an $(Al_xGa_{1-x})_{0.5}In_{0.5}P$ layer can minimize the lattice mismatch between the GaAs layer and the $(Al_xGa_{1-x})InP$ layer.

What is claimed is:

1. A semiconductor device comprising:

an $(Al_xGa_{1-x})InP$ layer epitaxially grown on a semiconductor substrate and having a region where the $(Al_xGa_{1-x})InP$ layer has a spontaneous superlattice broken to have a disordered configuration of Al, In and Ga in plane of a Group III atomic layer; and a semiconductor layer epitaxially grown on the $(Al_xGa_{1-x})InP$ layer and having the same conductivity type as the $(Al_xGa_{1-x})InP$ layer.

2. A semiconductor device according to claim 1, wherein the $(Al_xGa_{1-x})InP$ layer including: a first layer formed on the semiconductor substrate and having a spontaneous superlattice in which Al, In and Ga have an ordered configuration in plane of a Group III atomic layer; and a second layer formed on the first layer and having a spontaneous superlattice broken to have a disordered configuration of Al, In and Ga in plane of a Group III atomic layer.

3. A semiconductor device according to claim 1, wherein
a channel layer formed on the semiconductor substrate, an electron donating layer formed of the $(Al_xGa_{1-x})InP$ layer formed on the channel layer, and a cap layer formed of said semiconductor layer formed on the electron donating layer form a field effect transistor.

4. A semiconductor device according to claim 2, wherein
a channel layer formed on the semiconductor substrate, an electron donating layer formed of the $(Al_xGa_{1-x})InP$ layer formed on the channel layer, and a cap layer formed of said semiconductor layer formed on the electron donating layer form a field effect transistor.

5. A semiconductor device according to claim 3, wherein the $(Al_xGa_{1-x})InP$ layer has a planar doped region with an impurity doped in plane.

6. A semiconductor device according to claim 4, wherein the $(Al_xGa_{1-x})InP$ layer has a planar doped region with an impurity doped in plane.

7. A semiconductor device according to claim 3, wherein the channel layer is formed of a GaAs layer or an InGaAs layer.

8. A semiconductor device according to claim 4, wherein the channel layer is formed of a GaAs layer or an InGaAs layer.

9. A semiconductor device according to claim 1, wherein a collector layer formed on the semiconductor substrate, a base layer formed on the collector layer, an emitter layer formed of the $(Al_xGa_{1-x})InP$ layer formed on the base layer, and a cap layer formed of said semiconductor layer formed on the $(Al_xGa_{1-x})InP$ layer form a hetero-bipolar transistor.

10. A semiconductor device according to claim 2, wherein a collector layer formed on the semiconductor substrate, a base layer formed on the collector layer, an emitter layer formed of the $(Al_xGa_{1-x})InP$ layer formed on the base layer, and a cap layer formed of said semiconductor layer formed on the $(Al_xGa_{1-x})InP$ layer form a hetero-bipolar transistor.

11. A semiconductor device according to claim 1, wherein said semiconductor layer is formed of a GaAs layer, an AlGaAs layer or an InGaAs layer.

12. A semiconductor device according to claim 2, wherein said semiconductor layer is formed of a GaAs layer, an AlGaAs layer or an InGaAs layer.

13. A semiconductor device according to claim 1, wherein an Al composition X of the $(Al_xGa_{1-x})InP$ layer is not less than 0 and not more than 0.75.

14. A semiconductor device according to claim 13, wherein the Al composition X of the $(Al_xGa_{1-x})InP$ layer is 0 and the $(Al_xGa_{1-x})InP$ layer is a InGaP layer.

* * * * *